United States Patent [19]
Jaeger et al.

[11] Patent Number: 5,633,115
[45] Date of Patent: May 27, 1997

[54] METHOD FOR PREPARING AN ALUMINIUM FOIL FOR USE AS A SUPPORT IN LITHOGRAPHIC PRINTING PLATES

[75] Inventors: Nikolaas de Jaeger, Hove; Walter Verdyck, Schoten; Augustin Meisters, Gentbrugge, all of Belgium

[73] Assignee: Agfa-Gevaert, N.V., Mortsel, Belgium

[21] Appl. No.: 609,998

[22] Filed: Feb. 29, 1996

[30] Foreign Application Priority Data

Mar. 1, 1995 [EP] European Pat. Off. ............. 95200502

[51] Int. Cl.$^6$ .................. G03C 8/28; G03F 7/07
[52] U.S. Cl. .................. 430/231; 430/204; 430/232; 430/278.1; 101/459
[58] Field of Search .................. 430/204, 231, 430/232, 233, 278.1; 101/459

[56] References Cited

U.S. PATENT DOCUMENTS

| | | | |
|---|---|---|---|
| 3,819,374 | 6/1974 | Kemp | 430/204 |
| 4,483,913 | 11/1984 | Eklund et al. | 430/278.1 |
| 5,302,460 | 4/1994 | Pliefke et al. | 101/459 |
| 5,405,730 | 4/1995 | Coppens et al. | 430/204 |
| 5,427,889 | 6/1995 | Saikawa et al. | 430/204 |
| 5,436,110 | 7/1995 | Coppens et al. | 430/204 |

*Primary Examiner*—Richard L. Schilling
*Attorney, Agent, or Firm*—Breiner & Breiner

[57] ABSTRACT

The present invention provides a method for preparing an image receiving element comprising an aluminum foil as support comprising the steps of roughening and anodizing said aluminum foil and applying an image receiving layer containing physical development nuclei on said aluminum foil characterized in that said roughened and anodized aluminum foil is posttreated with an aqueous solution containing one or more organic compounds having at least one cationic group.

9 Claims, No Drawings

METHOD FOR PREPARING AN ALUMINIUM FOIL FOR USE AS A SUPPORT IN LITHOGRAPHIC PRINTING PLATES

DESCRIPTION

1. FIELD OF THE INVENTION

The present invention relates to a method for preparing an image receiving element comprising a toughened and anodized aluminum foil as support for making a printing plate according to the silver salt diffusion transfer process.

2. BACKGROUND OF THE INVENTION

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellent ink-receptive areas on a water-receptive ink-repellent background.

The DTR-image can be formed in the image receiving layer of a sheet or web material which is a separate element with respect to the photographic silver halide emulsion material (a so-called two-sheet DTR element) or in the image receiving layer of a so-called single-support-element, also called mono-sheet element, which contains at least one photographic silver halide emulsion layer integral with an image receiving layer in water-permeable relationship therewith. It is the latter mono-sheet version which is preferred for the preparation of offset printing plates by the DTR method.

Two main types of mono-sheet DTR materials that are distinct because of their different layer arrangement and processing are known. The first type of mono-sheet DTR material comprises on a support, generally paper or a resin support such as polyester, in the order given a silver halide emulsion layer and an image receiving layer containing physical development nuclei as a surface layer. After information-wise exposure and development according to the DTR process a silver image is formed in the surface layer. Since the underlying layers are hydrophilic in nature and the silver image formed on the surface is hydrophobic or can be rendered hydrophobic the thus obtained plate can be used without further processing. These type of printing plates have a low printing endurance typically around 10000 copies.

On the other hand mono-sheet DTR materials are known that comprise a hydrophilic support provided with an image receiving layer containing physical development nuclei and on top thereof a silver halide emulsion layer. After information-wise exposure and development according to the DTR-process a silver image is formed in The image receiving layer. In order to obtain a lithographic printing plate it will then be necessary to remove the now useless silver halide emulsion layer to expose the silver image formed in the image receiving layer. Said removal is generally carried out by rinsing the element with cold or warm water. This type of printing plate is disclosed in e.g. EP-A-278766, EP-A-483415 and EP-A-410500.

As a preferred support for the latter type of printing plates a toughened and anodized aluminum foil is used and high printing endurances can in principle be obtained. Such type of supports are well known for preparing printing plates using an imaging element having as a light sensitive coating photopolymers (hereinafter called PS-plates) instead of silver halide and are disclosed in e.g. DE-3717757, EP-A-167751, DE-3036174, U.S. Pat. No. 4336113, U.S. Pat. No. 4374710, U.S. Pat. No. 3980539, U.S. Pat. No. 3072546, U.S. Pat. No. 3073765, U.S. Pat. No. 3085950, U.S. Pat. No. 3935080 and U.S. Pat. No. 4052275.

However the requirements imposed on the aluminum foils for use as supports for PS-plates are different from the requirements imposed on the aluminum foils for use in the silver salt diffusion transfer process. Indeed, commonly employed aluminum foils as supports for PS-plates are not suited for preparing printing plates according to the silver salt diffusion transfer process.

In order to obtain printing plates according to the DTR process having good printing properties i.e. good ink acceptance in the image areas, no ink acceptance in the non-image areas called staining or toning and high printing endurances it is required that the adhesion of the image receiving layer containing the physical development nuclei to the aluminum foil is firm. When the adhesion of the image receiving layer to the aluminum foil is poor a certain amount of silver image deposited in the image receiving layer will be removed together with the silver halide emulsion layer during rinsing of the imaging element so that the actual yield or amount of silver deposited in the image receiving layer will be low and as a consequence the printing endurance may be low. Furthermore if the adhesion of the image receiving layer to the aluminum foil is low the silver image will also be worn away more rapidly during printing.

EP-A 567178 discloses a method for preparing an aluminum foil having an improved adhesion for an image receiving layer containing physical development nuclei comprising the steps of roughening and anodizing an aluminum foil and posttreating said toughened and anodized aluminum foil with an aqueous bicarbonate containing solution. However, the result could still use some improvement.

3. SUMMARY OF THE INVENTION

It is an object of the present invention to provide a method for preparing an image receiving element comprising an aluminum foil as support, said aluminum foil having a high adhesion for an image receiving layer containing physical development nuclei.

It is an other object of the present invention to provide an aluminum based mono-sheet DTR material for preparing a lithographic printing plate having good printing properties.

Further objects of the present invention will be clear from the description hereinafter.

According to the present invention there is provided a method for preparing an image receiving element comprising an aluminum foil as support comprising the steps of roughening and anodizing said aluminum foil and applying an image receiving layer containing physical development nuclei on said aluminum foil characterized in that said roughened and anodized aluminum foil is posttreated with an aqueous solution containing one or more organic compounds having at least one cationic group.

According to the present invention there is also provided a mono-sheet DTR material comprising on the image receiving element a silver halide emulsion layer being in water permeable contact with the image receiving layer.

4. DETAILED DESCRIPTION OF THE INVENTION

According to the present invention it has been found that by posttreating an aluminum foil with an aqueous solution containing one or more organic compounds having at least one cationic group after roughening and anodizing said aluminum foil the adhesion of an image receiving layer containing physical development nuclei to the aluminum foil is improved as revealed from the increased amount of silver precipitated in the image receiving layer when the aluminum foil provided with an image receiving layer is used in a DTR-process.

As mentioned above a DTR-image on a hydrophilic background i.e. on a hydrophilic aluminum foil can be used in lithographic printing. Because of the improved adhesion of the nuclei to the aluminum foil prepared according to the invention more silver is deposited in the image receiving layer and a silver image is obtained with an improved wear resistance and as a consequence high printing endurance can be obtained.

The posttreatment of an aluminum foil with an aqueous solution containing one or more organic compounds having at least one cationic group after roughening and anodizing said aluminum foil preferably proceed before the image receiving layer comprising physical development nuclei is applied to said toughened and anodized aluminum foil.

The posttreatment of an aluminum foil with an aqueous solution containing one or more organic compounds having at least one cationic group after roughening and anodizing said aluminum foil can proceed in different ways e.g. by rubbing with a roller, by wiping with an absorbent means e.g. with a plug of cotton or a sponge but preferably by dipping the material to be treated in the aqueous solution.

The temperature of said aqueous solution ranges preferably from 10° C. to 80° C., more preferably from 20° C. to 60° C. The contact time is preferably at least 2 s, more preferably at least 10 s, most preferably at least 20 s. The upper limit is not very important but is for practical reasons preferably not more than 300 s, more preferably not more than 180 s.

The total amount of said one or more organic compounds having at least one cationic group in the aqueous solution ranges preferably from 0.005 to 4 % by weight, more preferably from 0.01 to 2% by weight, most preferably from 0.02 to 1% by weight According to the invention, the one or more organic compounds having at least one cationic group are preferably hydrophilic. At least one of said one or more organic compounds may be a quaternary ammonium salt, more preferably a ternary sulfonium salt, most preferably a quaternary phosphonium salt, e.g. those described in U.S. Pat. No. 3271147 and U.S. Pat. No. 3271148. At least one of said one or more organic compounds may be a low molecular weight compound but preferably at least one of said one or more organic compounds is a polymer.

Although according to the invention said solution may comprise Cationic compounds in admixture, preference is given to the use of a single compound in said solution.

Particularly preferred organic compounds having at least one cationic group are compounds comprising randomly distributed recurring units corresponding to the general formula (I)

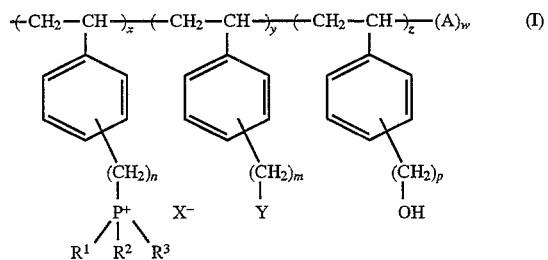

wherein:

A represents a unit that is derived from a copolymerizable monomer having a hydrophobic character e.g. styrene, vinyltoluene and homologues, 2- and 4-homologues of vinylpyridine, 2-methyl,5-vinylpyridine, alkyl methacrylate with alkyl being a $C_1$–$C_5$ alkyl group, alkyl acrylates with alkyl being a $C_1$–$C_5$ alkyl group, vinylacetate, acrylonitrile, methacrylonitrile, allylcyanide, crotonnitrile, cyanoalkyl acrylate with alkyl being a $C_1$–$C_5$ alkyl group, diacetone acrylamide or diacetone methacrylamide;

n, m and p each independently represent an integer ranging from 1 to 12, more preferably from 1 to 4, most preferably 1;

$R^1$, $R^2$ and $R^3$ each independently represents a $C_1$–$C_8$ alkyl group e.g. n-butyl, a substituted $C_1$–$C_8$ alkyl group e.g. a methylol group, a cyanoethyl group or an aralkyl group, a cycloalkyl group, an aryl group e.g. phenyl, or a substituted aryl group;

$X^-$ represents an acid anion e.g. a halogen anion e.g. $Cl^-$, $Br^-$ or $I^-$, or an anion derived from an inorganic acid e.g. $NO_3^-$, $HSO_4^-$, $SO_4^{--}$, $H_2PO_4^-$, $HPO_4^{--}$ or $PO_4^{---}$;

Y represents a nucleophilic group e.g. a halogen atom e.g. Cl, Br, I, $NO_3$, tosylaat etc.;

x+y+z represents from 2 mole % to 70 mole % with y+z maximum 15 mole % and x at least 1 mole % and w represents from 30 mole % to 98 mole %.

Very particularly preferred organic compounds having at least one cationic group are compounds comprising randomly distributed recurring units corresponding to the general formula (II)

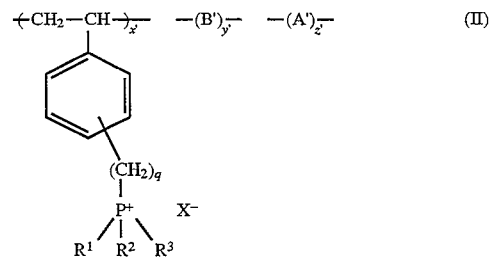

wherein:

B' represents a unit that is derived from a copolymerizable monomer comprising a nitrogen atom linked to at least one vinyl group or at least one alkyl group e.g. N-vinylimidazole, 2-methyl-1-vinylimidazole, 2-vinylimidazoline, 2-vinyl-3,4,5,6-tetrahydropyrimidinine, vinylamine, 1-methylvinylamine, 1-ethylvinylamine, aminoethyl acrylate, aminoethyl methacrylate, aminoethyl acrylamide, aminoethyl methacrylamide, vinylalkylamine, vinyldialkylamine, 1-methylvinylalkylamine, 1-methylvinyldialkylamine, 1-ethylvinylalkylamine, 1-ethylvinyldialkylamine, alkylaminoethyl acrylate, dialkylaminoethyl acrylate, alkylaminoethyl methacrylate or dialkylaminoethyl methacrylate with alkyl being a methyl or ethyl group:

A' represents a unit that is derived from a copolymerizable monomer having a hydrophobic character as described above:

q represents an integer ranging from 1 to 12, preferably from 1 to 4, more preferably 1;

$R^1$, $R^2$ and $R^3$ each independently represents a $C_1$–$C_8$ alkyl group e.g. n-butyl, a substituted $C_1$–$C_8$ alkyl group e.g. a methylol group, a cyanoethyl group or an aralkyl group, a cycloalkyl group, an aryl group e.g. phenyl, or a substituted aryl group;

$X^-$ represents an acid anion e.g. a halogen anion e.g. $Cl^-$, $Br^-$ or $I^-$, or an anion derived from an inorganic acid e.g. $NO_3^-$, $HSO_4^-$, $SO_4^{--}$, $H_2PO_4^-$, $HPO_4^{--}$ or $PO_4^{---}$;

x' represents from 5 mole % to 80 mole %;

y' represents from 20 mole % to 95 mole % and z' represents from 0 mole % to 65 mole %.

Preferred units A are N-vinylimidazole and 2-methyl-1-vinylimidazole. Preferred units B are acrylonitrile and methacrylonitrila.

The following preparations illustrate the synthesis of some particularly useful mordanting polymers in accordance with the present invention.

Compound 1: Co(N-vinylimidazole/m,p-vinylbenzyl, tributylphosphonium chloride 70.6 mole % / 29.4 mole%)

a) Preparation of m,p-vinylbenzyl,tributylphosphonium chloride

A 3-liter reaction vessel was provided with a stirring device, a thermometer, a reflux condenser and a dropping funnel.

The following ingredients were introduced in this reaction vessel: 457.5 g (3.0 mole) of m,p-vinylbenzyl chloride (sold by Dow Chemical Co.), 1.2 g of methoxyphenol as polymerization inhibitor and 1000 ml of ethanol. The reaction mixture was stirred at room temperature to reach a homogeneous solution. This solution was placed on a water bath of 80° C.

The dropping funnel was filled with 669.8 g (3.15 mole) of 95% tributylphosphine. As soon as the solution temperature reached 38° C. one started to add the tributylphosphine at a rate of ca. 8 g/min.

The quaternization reaction proceeded exothermally and after 20 minutes the solution temperature had increased to 78° C. A gentle reflux was obtained and the heating was turned off.

After 1 h 20 min the total amount of tributylphosphine had been added and the solution temperature had dropped to 74° C. The reaction still proceeded slightly exothermally and the temperature remained constant without further heating.

After 2 h 50 min the heating was used again. The temperature in the alcohol solution increased to 78° C. whereupon it decreased slowly to 75° C. while continuously keeping the water-bath at 80° C.

After a total reaction time of 5 hours the water-bath was taken away and the solution was concentrated under reduced pressure to obtain 1234.4 g of concentrated solution.

The m,p-vinylbenzyl,tributylphosphonium chloride partially precipitated and 2100 ml of ethyl acetate was added. By heating on a water-bath of 75° C. a homogeneous solution was obtained which was filtered warm and then cooled.

The precipitated m,p-vinylbenzyl,tributylphosphonium chloride was filtered off and washed with 400 ml of ether. The filtrate was concentrated half under reduced pressure and poured out into a mixture of 1 l of hexane and 2 l of ether. A further amount of m,p-vinylbenzyl, tributylphosphonium chloride was filtered off after cooling.

Yield: 962.4 g.

By NMR analysis it was found that the obtained compound comprised at the most a few percentages of impurities. By titration it was found that the ionic chlorine content was 2.81 meq./g (99.6 %) and the water content 0.42 meq./g (0.43%).

b) Preparation of co(N-vinylimidazole/m,p-vinylbenzyl, tributylphosphonium chloride)

In a 500 ml reaction flask, provided with stirrer, reflux condenser, thermometer and nitrogen inlet tube 25.44 g of distilled N-vinylimidazole (0.87 mole), 42.54 g of m,p-vinylbenzyl,tributylphosphonium chloride (0.12 mole) and 0.34 g of azobisisobutyronitrile together with 203 ml of ethanol were dissolved at room temperature.

A gentle nitrogen stream was introduced into this solution and the heating was switched on.

After 1 hour the solution temperature reached 78° C. and was kept constant while stirring and introducing nitrogen.

After 19 hours the solution became slightly viscous and a further amount of azobisisobutyronitrile (0.34 g) was added.

After a reaction period of 27 hours again azobisisobutyronitrile (0.20 g) was added. Hereupon the reaction mixture was stirred at 77°–78° C. under nitrogen atmosphere for 16 hours.

The polymer solution was cooled and poured out in a stirred mixture of 2 l of hexane and 1 l of acetone. The copolymer precipitated as a viscous mass, which after washing with a mixture of 200 ml of hexane and 100 ml of acetone, was redissolved again in a mixture of 400 ml of ethanol and 200 ml of water.

From a little amount of this solution the solvent was evaporated and the obtained copolymer analyzed: phosphonium chloride content=1.659 meq./g, N-vinylimidazole content: 3.957 meq./g, water content=2.15 meq./g from which can be calculated that x=29.4 mole % or 61.1 wt %, y=70.6 mole % or 38.9 wt %.

From the remaining water-alcohol solution the ethanol was removed by distillation and the pH adjusted to 7.0 by adding acetic acid. The obtained copolymer solution was diluted with water to obtain 330 g (20 wt %).

Compound 2: Co(N-vinylimidazole/m,p-vinylbenzyl, tributylphosphonium chloride 78.4 mole % / 21.6 mole%)

In an anologuous way as described in preparation 1, a N-vinylimidazole/m,p-vinylbenzyl,tributylphosphonium chloride copolymer was prepared starting with 33.0 g of distilled N-vinylimidazole, 31.1 g of m,p-vinylbenzyl, tributylphosphonium chloride, 200 ml of ethanol and 0.33 g of azobisisobutyronitrile. After 18 hours a further amount of azobisisobutyronitrile (0.32 g) was added and after a reaction time of 24 hours again 0.16 g azobisisobutyronitrile was added.

Yield: 65.7 g of copolymer.

Analysis of the copolymer: phosphonium chloride content=1.368 meq./g, N-vinylimidazole content =4,972 meq./g, water content=2.65 meq./g from which can be calculated that x=21.6 mole % or 50.9 wt %, y=78.4 mole % or 49.1 wt %.

Compound 3: Co(acrylonitrile/N-vinylimidazole/m,p-vinylbenzyl, tributylphosphonium chloride 46.6 mole %/35.5 mole %/17.9 mole %)

In a 5-liter flask, provided with stirrer, reflux condenser, thermometer and nitrogen inlet tube, 148.4 g (40 mole %) of acrylonitrile, 263.2 g (40 mole %) of distilled N-vinylimidazole and 496.3 g (20 mole %) of m,p-vinylbenzyl,tributylphosphonium chloride together with 4.53 g of azobisisobutyronitrile were introduced and dissolved in 2270 ml of ethanol.

While stirring and introducing nitrogen this solution was gradually heated to obtain a gentle reflux.

At the start of the heating the solution was green colored. After 45 minutes, at a temperature of 64° C., it became deep-blue. After 1 h 30 min the temperature reached 78° C. and a gentle reflux was obtained. After 1 h 50 min the solution turned red.

After 20 hours the obtained red solution became slightly viscous and a further amount of azobisisobutyronitrile (4.53 g) was added. The color changed from red to pale-orange.

After 23 hours a relative viscous, orange-colored solution was obtained wherefrom part of the ethanol was distilled off. After 25 hours 1 l of ethanol was distilled off whereupon the viscous solution was poured out into 8 l of hexane while stirring. The precipitated copolymer was redissolved in ethanol.

Yield: 2301 g, 38.17 wt %.

Analysis of the copolymer: phosphonium chloride content=1.439 meq./g, N-vinylimidazole content=2.858 meq./g, water content=1.23 meq./g from which can be calculated that x=17.9 mole % or 52.1 wt %, y=35.5 mole % or 27.5 wt %, z=46.6 mole % or 20.4 wt %.

For use of the copolymer the ethanol was removed from this solution while simultaneously adding the same amount of water. Yield: 2486 g, 35 wt %, pH=7. Viscosity of a 20 wt % solution in water at 25° C.: 36.2 mPas.

Compound 4: Co(acrylonitrile/N-vinylimidazole/m,p-vinylbenzyl, tributylphosphonium chloride 29.4 mole %/30.1 mole %/40.5 mole %)

In an analoguous way as described in preparation 3, an acrylonitrile/N-vinylimidazole/m,p-vinylbenzyl, tributylphosphonium chloride copolymer was prepared starting with 30 mole % acrylonitrile, 30 mole % vinylimidazole and 40 mole % m,p-vinylbenzyl, tributylphosphonium chloride.

Yield: 905.6 g.

Analysis of the copolymer: phosphonium chloride content=2.073 meq./g, N-vinylimidazole content=1.544 meq./g, water content=2.22 meq./g from which can be calculated that x=40.45 mole % or 76.56 wt %, y=30.1 mole % or 15.11 wt%, z=29.45 mole % or 8.33 wt %.

Viscosity of a 20 wt % solution in water at 25° C.: 36.5 mPa s

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

Preferably the aluminum foil has a roughness with a CLA value between 0.2 and 1.5 µm and an anodization layer with a thickness between 0.4 and 2.0 µm.

According to the present invention the roughening of the aluminum foil can be performed according to the methods well known in the prior art.

The surface of the aluminum substrate can be roughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

Mechanical graining can be performed by e.g. sand blasting, ball graining, wire graining, brush graining, slurry graining or a combination of these, etc..

Chemical graining can be done e.g. by alkaline etching as disclosed in Jap. Patent Application No. 61304/76, with a saturated aqueous solution of an aluminum salt of a mineral acid, etc..

The electrochemical graining process is preferred because it can form a uniform surface roughness having a large average surface area with a very fine and even grain which is commonly desired when used for lithographic printing plates.

To obtain a finely grained surface topography the optimum concentration and temperature of the electrolytic solution, the current form and density must be chosen.

According to the present invention electrochemical graining can be conducted in a hydrochloric and/or nitric acid containing electrolyte solution using an alternating or direct current. Other aqueous solutions that can be used in the electrochemical graining are e.g. acids like $HNO_3$, $H_2SO_4$, $H_3PO_4$, that if desired, contain additionally one or more corrosion inhibitors such as $Al(NO_3)_3$, $AlCl_3$, boric acid, chromic acid, sulfates, chlorides, nitrates, monoamines, diamines, aldehydes, phosphates, $H_2O_2$, etc..

Electrochemical graining in connection with the present invention can be performed using single-phase and three-phase alternating current. Alternating current waves can be a sine wave, a square wave, trapezoidal wave, etc.. The anodic charge may be greater or lower than the cathodic charge. The voltage applied to the aluminum plate is about 1–60 V and preferably 10–35 V. A current density of 3–150 Amp/dm$^2$ is employed for 5–240 seconds. The temperature of the electrolytic graining solution may vary from 5°–50° C. Electrochemical graining is carried out preferably with an alternating current from 10 Hz to 300 Hz.

Mechanical and electrochemical methods may be combined as disclosed in U.S. Pat. No. 4,476,006 and 4,477,317.

The roughening is preferably preceded by a degreasing treatment mainly for removing greasy substances from the surface of the aluminum foil.

Therefore the aluminum foil may be subjected to a degreasing treatment with a surfactant and/or an aqueous alkaline solution to thereby remove rolling oil, dust, rust and other impurities on the surface thereof. Degreasing can be performed by a 2-step treatment either treating the aluminum foil with an alkaline solution followed by a desmutting in an acidic solution or degreasing in an acidic solution followed by an alkaline desmutting. Acidic solutions preferably contain chromic acid, phosphoric acid or sulphuric acid, and usable alkaline solutions may contain NaOH, KOH, etc..

Preferably roughening is followed by a chemical etching step using an aqueous solution containing an acid. The chemical etching is preferably carried out at a temperature of at least 30° C. more preferably at least 40° C. and most preferably at least 50° C. When too low temperatures during chemical etching are employed a poor adhesion of the image receiving layer to the aluminum foil may result. There is no specific upper limit as to the temperature of chemical etching but for convenience the temperature will generally be kept below the boiling point of the solution preferably below 90° C.

Suitable acids for use in the aqueous etch solution are preferably inorganic acids and most preferably acids with a $pK_a$ of at most 1. Examples of acids that are particularily suitable are e.g. $H_2SO_4$, HCl , $HNO_3$, HF, $H_3PO_4$ etc. or mixtures thereof. Acids with a $pK_a$ of more than 1 may also be used in admixture with acids with a $pK_a$ of at most 1. The total amount of acid in the aqueous etch solution is preferably at least 150 g/l, more preferably at least 200 g/l and most preferably at least 250 g/l. The actual amount of acid is determined e.g. by temperature and duration of etching. Generally lower amounts of acid can be used with increasing temperature and duration. The duration of chemical etching is preferably between 3 s and 5 min. and more preferably between 3 s and 4 min.

Alternatively chemical etching may be carried out using an aqueous solution containing alkali. Suitable alkali are e.g. sodium hydroxide, potassium hydroxide etc.. Preference is however given to chemical etching using an acidic solution or to chemical etching using in the order given an alkaline solution, an optional rinsing solution and an acid solution since it has been found that the effect of the posttreatment of the aluminum foil with an aqueous solution containing an organic compound having at least one cationic group after anodization is much more pronounced when the chemical etching is done as described above.

According to the present invention after the roughening of the aluminum foil and optional chemical etching the aluminum foil is anodized which may be carried out as follows.

An electric current is passed through the grained aluminum foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1 to 70 % by weight can be used at a temperature in the range from 0°–70° C., preferably at a temperature in the range from 35°–60° C., more preferably at a temperature in the range from 40°–50° C. The anodic current density may vary from 1–50 A/dm$^2$ and the voltage within the range 1–100 V to obtain an anodized film weight of 1–8 g/m$^2$ Al$_2$O$_3$.H$_2$O. The anodized aluminum foil may subsequently be rinsed with demineralized water at a temperature in the range of 10°–80° C.

Preferably each of the above described steps is separated by a rinsing step to avoid contamination of the liquid used in a particular step with that of the preceding step.

The posttreatment of an aluminum foil with an aqueous solution containing an organic compound having at least one cationic group after roughening and anodizing said aluminum foil is preferably followed by a rinsing of said posttreated aluminum foil with demineralized water. The rinsing time preferably ranges from 5 s to 300 s, more preferably from 10 s to 120 s. The temperature of said rinsing water is preferably between 10° C. and 60° C., more preferably between 20° C. and 50° C.

To promote the image sharpness and, as a consequence thereof, the sharpness of the final printed copy, the anodization layer may be coloured in the mass with an antihalation dye or pigment e.g. as described in JA-Pu-58-14,797.

Subsequent to the preparation of the aluminum foil as described above the aluminum foil may be immediately coated with a solution containing the physical development nuclei or may be coated with said solution at a later stage.

The image receiving layer containing physical development nuclei may be free of hydrophilic binder but preferably comprises small amounts up to 80% by weight of the total weight of said layer of a hydrophilic colloid e.g. polyvinyl alcohol to improve the hydrophilicity of the surface.

Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

The aluminum support according to the present invention is especially suited for preparing a mono-sheet DTR material. According to the method of the present invention for obtaining a mono-sheet DTR material an aluminum foil prepared as described above and provided with an image receiving layer is provided with a photosensitive layer in water permeable contact with said image receiving layer.

Layers being in water permeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or the complexed silver.

The photosensitive layer used according to the present invention may be any layer comprising a hydrophilic colloid binder and at least one silver halide emulsion, at least one of the silver halide emulsions being photosensitive.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G.F. Duffin in "Photographic Emulsion Chemistry", The Focal Press, London (1966), and by V.L. Zelikman et al in "Making and Coating Photographic Emulsion", The Focal Press, London (1966).

For use according to the present invention the silver halide emulsion or emulsions preferably consist principally of silver chloride while a fraction of silver bromide may be present ranging from 1 mole % to 40 mole %. Most preferably a silver halide emulsion containing at least 70 mole% of silver chloride is used.

The average size of the silver halide grains may range from 0.10 to 0.70 μm , preferably from 0.25 to 0.45 μm.

Preferably during or after the precipitation stage iridium and/or rhodium containing compounds or a mixture of both are added. The concentration of these added compounds ranges from $10^{-8}$ to $10^{-3}$ mole per mole of AgNO$_3$, preferably between $10^{-7}$ and $10^{-5}$ mole per mole of AgNO$_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

Apart from negative-working silver halide emulsions that are preferred for their high photosensitivity, use can be made also of direct-positive silver halide emulsions that produce a positive silver image in the emulsion layer(s) and a negative image on the image-receiving layer.

Suitable direct positive silver halide emulsions for use in accordance with the present invention are silver halide emulsions that have been previously fogged or that mainly form an internal latent image.

Internal latent image-type silver halide emulsions that can be used in accordance with the present invention have been described in e.g. U.S. Pat Nos. 2,592,250, 3,206,313, 3,271, 157, 3,447,927, 3,511,662, 3,737,313, 3,761,276, GB-A 1,027,146, and JA Patent Publication No. 34,213/77. However, the silver halide emulsions used in the present invention are not limited to the silver halide emulsions described in these documents.

The other type of direct positive type silver halide emulsions for use in accordance with the present invention, which is of the previously fogged type, may be prepared by overall exposing a silver halide emulsion to light and/or by chemically fogging a silver halide emulsion. Chemical fog specks may be formed by various methods for chemical sensitization.

Chemical fogging may be carried out by reduction or by a compound which is more electropositive than silver e.g. gold salts, platinum salts, iridium salts etc., or a combination of both. Reduction fogging of the silver halide grains may occur by high pH and/or low pAg silver halide precipitation or digestion conditions e.g. as described by Wood J. Phot. Sci. 1 (1953), 163 or by treatment with reducing agents e.g. tin(II) salts which include tin(II)chloride, tin complexes and tin chelates of (poly)amino(poly)carboxylic acid type as described in British Patent 1,209,050 , formaldehyde, hydrazine, hydroxylamine, sulphur compounds e.g. thiourea dioxide, phosphonium salts e.g. tetra(hydroxymethyl)-phosphonium chloride, polyamines e.g. diethylenetriamine, bis(p-aminoethyl)sulphide and its water-soluble salts, hydrazine derivatives, alkali arsenite, amine borane etc. or mixtures thereof.

When fogging of the silver halide grains occurs by means of a reducing agent e.g. thiourea dioxide and a compound of a metal more electropositive than silver especially a gold compound, the reducing agent is preferably used initially and the gold compound subsequently. However, the reverse order can be used or both compounds can be used simultaneously.

In addition to the above described methods of chemically fogging chemical fogging can be attained by using said fogging agents in combination with a sulphur-containing sensitizer, e.g. sodium thiosulphate or a thiocyanic acid compound e.g. potassium thiocyanate.

The silver halide emulsions of the DTR-element can be spectrally sensitized according to the spectral emission of the exposure source for which the DTR element is designed.

Suitable sensitizing dyes for the visible spectral region include methine dyes such as those described by F.M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

The silver halide emulsion layers usually contains gelatin as hydrophilic colloid binder. Mixtures of different gelatins with different viscosities can be used to adjust the rheological properties of the layer. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

Preferably the gelatin layer(s) is(are) substantially unhardened. Substantially unhardened means that when such gelatin layer is coated on a subbed polyethylene terephtalate film base at a dry thickness of 1.2 g/m², dried for 3 days at 57° C. and 35% R.H. and dipped in water of 30° C., said gelatin layer is dissolved for more than 95 % by weight within 5 minutes.

The silver halide emulsions may contain pH controlling ingredients. Preferably at least one gelatin containing layer is coated at a pH value not below the iso-electric point of the gelatin to avoid interactions between said gelatin containing layer and another (optional) layer. Most preferably all the gelatin containing layers are coated at a pH value not below the isoelectric point of their gelatin. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787 and DE-P 2,453,217.

More details about the composition, preparation and coating of silver halide emulsions suitable for use in accordance with the present invention can be found in e.g. Product Licensing Index, Vol. 92, December 1971, publication 9232, p. 107–109.

Preferably, the imaging element also comprises an intermediate layer between the image receiving layer on the hydrophilic surface of a support and the photosensitive layer(packet) to facilate the removal of said layer(packet) thereby uncovering the silver image formed in the image receiving layer by processing the imaging element.

In one embodiment, the intermediate layer is a water-swellable intermediate layer coated at a ratio of 0.01 to 2.0 g/m² and comprising at least one non-proteinic hydrophilic film-forming polymer e.g. polyvinyl alcohol and optionally comprising an antihalation dye or pigment as disclosed in EP-A-410500.

In another embodiment, the intermediate layer is a layer comprising hydrophobic polymer beads having an average diameter not lower than 0.2 µm and having been prepared by polymerization of at least one ethylenically unsaturated monomer. Preferably, said intermediate layer in dry condition comprises said hydrophobic polymer beads in an amount of up to 80% of its total weight. Further details are disclosed in EP-A-483415.

A supplemental intermediate layer, which may be present between said silver halide emulsion containing layer and said water-swellable intermediate layer or said intermediate layer comprising hydrophobic polymer beads may incorporate one or more ingredients such as i.a. antihalation dyes or pigment, developing agents, silver halide solvents, base precursors, and anticorrosion substances.

The silver halide emulsion layer and optional other layers may be coated to the aluminum support according to the present invention provided with an image receiving layer using commonly applied coating techniques as slide hopper coating or curtain coating. Alternatively these layers may be first coated to a temporary support e.g. a polyester film and subsequently laminated to the aluminum support as disclosed in EP-A-410500.

When the imaging element is prepared by laminating a layer packet comprising a photosensitive layer onto the image receiving layer the intermediate layer(s) are provided on the photosensitive layer(s), the water-swellable intermediate layer or the intermediate layer comprising hydrophobic polymer beads having an average diameter not lower than 0.2 µm and having been prepared by polymerization of at least one ethylenically unsaturated monomer being the upper layer.

Although the aluminum support according to the present invention is mainly intended as a support for a monosheet DTR material it is equally well suited for use as a receiving material in a two-sheet DTR process.

According to the present invention the imaging element can be information-wise exposed in an apparatus according to its particular application. A wide choice of cameras for exposing the photosensitive silver halide emulsion exists on the market. Horizontal, vertical and darkroom type cameras and contact-exposure apparatus are available to suit any particular class of reprographic work. The imaging element in accordance with the present invention can also be exposed with the aid of i.a. laser recorders and cathode rays tubes.

According to the present invention the development and diffusion transfer of the information-wise exposed imaging element in order to form a silver image in said photosensitive layer and to allow unreduced silver halide or complexes formed thereof to diffuse image-wise from the photosensitive layer to said image receiving layer to produce therein a silver image, are effected with the aid of an aqueous alkaline solution in the presence of (a) developing agent(s), and (a) silver halide solvent(s). The developing agent(s) and/or the silver halide solvent(s) can be incorporated in the aqueous alkaline solution and/or in the imaging element.

Preferably a silver halide solvent in the aqueous alkaline solution is used in an amount between 0.05% by weight and 5% by weight and more preferably between 0.5% by weight and 2% by weight. The silver halide solvent, which acts as a complexing agent for silver halide, preferably is a water-soluble thiosulphate or thiocyanate e.g. sodium, potassium, or ammonium thiosulphate and sodium, potassium, or ammonium thiocyanate.

Further silver halide solvents that can be used in connection with the present invention are e.g. sulphite, amines, 2-mercaptobenzoic acid, cyclic imide compounds such as e.g. uracil, 5,5-dialkylhydantoins, alkyl sulfones and oxazolidones.

Further silver halide solvents for use in connection with the present invention are alkanolamines. Examples of alkanolamines that may be used in connection with the present invention correspond to the following formula:

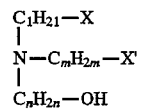

wherein X and X' independently represent hydrogen, a hydroxyl group or an amino group, 1 and m represent 0 or integers of 1 or more and n represents an integer of 1 or more. Said alkanolamines may be present in the alkaline processing liquid in a concentration preferably between 0.1% and 5% by weight. However part or all of the alkanolamine can be present in one or more layers of the imaging element.

Still other preferred further silver halide solvents for use in connection with the present invention are thioethers. Preferably used thioethers correspond to the following general formula:

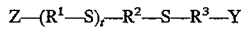

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain a oxygen bridge and t represents an integer from 0 to 10. Examples of thioether compounds corresponding to the above formula are disclosed in e.g. U.S. Pat. No. 4,960,683 and EP-A 554,585.

Still further suitable silver halide solvents are 1,2,4-triazolium-3-thiolates, preferably 1,2,4-triazolium-3-thiolates substituted with at least one substituent selected from the group consisting of a $C_1$–$C_8$ alkyl group that contains at least 3 fluorine atoms, a $C_4$–$C_{10}$ hydrocarbon group and a 4-amino group substituted with a $C_1$–$C_8$ alkyl group that contains at least 3 fluorine atoms and/or a $C_4$–$C_{10}$ hydrocarbon group.

Combinations of different silver halide solvents can be used and it is also possible to incorporate at least one silver halide solvent into a suitable layer of the imaging element and to add at least one other silver halide solvent to the developing solution.

The alkaline processing liquid may also contain (a) developing agent(s). In this case the alkaline processing liquid is called a developer. On the other hand some or all of the developing agent(s) may be present in one or more layers of the photographic material or imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are the 1-phenyl-3-pyrazolidinones. Even more preferred, particularly when they are incorporated into the photographic material are 1-phenyl-3-pyrazolidinones of which the aqueous solubility is increased by a hydrophilic substituent such as e.g. hydroxy0 amino, carboxylic acid group, sulphonic acid group etc.. Examples of 1-phenyl-3-pyrazolidinones subsituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc.. However other developing agents can be used.

Preferred amounts of the hydroquinone-type developing agents are in the range of 0.05 mole to 0.40 mole per litre and preferred amounts of secondary developing agent(s) in the range of $1.8 \times 10^{-3}$ to $2.0 \times 10^{-1}$ mole per litre.

The aqueous alkaline solution in accordance with the present invention may further comprise sulphite e.g. sodium sulphite in an amount ranging from 40 g to 180 g per liter, preferably from 60 to 160 g per liter in combination with another silver halide solvent.

The quantitative ranges given for the developing agents, silver halide solvents, and sulphite apply to the amount of these compounds present as solutes in the aqueous alkaline solution during the DTR-processing, whether these compounds make part of the aqueous alkaline solution or were dissolved from the layers containing them upon application thereto of the aqueous alkaline solution.

The aqueous alkaline solution suitable for use according to the present invention preferably comprises aluminum ions in an amount of at least 0.3 g/l, more preferably in an amount of at least 0.6 g/l in order to prevent sticking of the emulsion layer to the transporting rollers when the emulsion is swollen with the aqueous alkaline solution.

The alkaline processing liquid preferably has a pH between 9 and 14 and more preferably between 10 and 13, but depends on the type of silver halide emulsion material to be developed, intended development time, and processing temperature.

The processing conditions such as temperature and time may vary within broad ranges provided the mechanical strength of the materials to be processed is not adversely influenced and no decomposition takes place.

The pH of the alkaline processing liquid may be established by an organic or inorganic alkaline substance or a combination thereof. Suitable inorganic alkaline substances are e.g. hydroxides of sodium and potassium, alkali metal salts of phosphoric acid and/or silicic acid e.g. trisodium phosphate, orthosilicates, metasilicates, hydrodisilicates of sodium or potassium, and sodium carbonate etc.. Suitable organic alkaline substances are e.g. alkanolamines. In the latter case the alkanolamines will provide or help providing the pH and serve as a silver halide complexing agent.

The aqueous alkaline solution may further comprise hydrophobizing agents for improving the hydrophobicity of the silver image obtained in the image receiving layer. Generally these compounds contain a mercapto group or thiolate group and one or more hydrophobic substituents. Particularly preferred hydrophobizing agents are mercapto-1,3,4-thiadiazoles as described in DE-A 1,228,927 and in U.S. Pat. No. 4,563,410, 2-mercapto-5-heptyl-oxa 3,4-diazole and long chain (at least 5 carbon atoms) alkyl substituted mercaptotetrazoles. The hydrophobizing agents can be used alone or in combination with each other.

These hydrophobizing compounds can be added to the aqueous alkaline solution in an amount of preferably 0.1 to 3 g per litre and preferably in admixture with 1-phenyl-5-mercaptotetrazole, the latter compound may be used in amounts of e.g. 50 mg to 1.2 g per litre of solution, which may contain a minor amount of ethanol to improve the dissolution of said compounds.

The aqueous alkaline solution may comprise other ingredients such as e.g. oxidation preservatives, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not.

The development may be stopped though this is often not necessary with a so-called stabilization liquid, which actually is an acidic stop-bath having a pH preferably in the range from 5 to 7.

Bufferred stop bath compositions comprising a mixture of sodium dihydrogen orthophosphate and disodium hydrogen orthophosphate and having a pH in said range are preferred.

The development and diffusion transfer can be initiated in different ways e.g. by rubbing with a roller, by wiping with an absorbent means e.g. with a plug of cotton or sponge, or by dipping the material to be treated in the liquid composition. Preferably, they proceed in an automatically operated apparatus. They are normally carried out at a temperature in the range of 18° C. to 30° C. and in a time from 5 s to 5 min.

After formation of the silver image on the hydrophilic surface of a support an excess of aqueous alkaline solution still present on the base may be eliminated, preferably by guiding the foil through a pair of squeezing rollers.

The silver image thus obtained in the layer of physical development nuclei is subsequently uncovered by treating the imaging element to remove all the layers above the layer containing physical development nuclei, thereby exposing the imaged surface of the hydrophilic support.

According to a particularly preferred embodiment of the present invention the silver image in the layer of physical development nuclei is uncovered by washing off all the layers above the layer containing physical development nuclei with rinsing water.

The temperature of the rinsing water may be varied widely but is preferably between 30° C. and 50° C., more preferably between 35° C. and 45° C.

The imaged surface of the hydrophilic surface of a support can be subjected to a chemical treatment that increases the hydrophilicity of the non-silver image parts and the oleophilicity of the silver image This chemical after-treatment is preferably carried out with a lithographic composition often called finisher comprising at least one compound enhancing the ink-receptivity and/or lacquer-receptivity of the silver image and at least one compound that improves the ink-repelling characteristics of the hydrophilic surface.

Suitable ingredients for the finisher are e.g. organic compounds containing a mercapto group such as the hydrophobizing compounds referred to hereinbefore for the alkaline solution. Preferred compounds correspond to one of the following formulas:

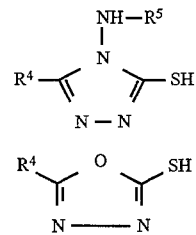

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms. Said (a) hydrophobizing agent(s) is(are) comprised in the finisher preferably in a total concentration between 0.1 g/l and 10 g/10 more preferably in a total concentration between 0.3 g/l and 3 g/l .

Additives improving the oleophilic ink-repellency of the hydrophilic surface areas are e.g. carbohydrates such as acidic polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, polyglycols being the reaction products of ethyleneoxide and/or propyleneoxide with water or an alcohol and polyvinyl alcohol. Optionally, hygroscopic substances e.g. sorbitol, glycerol, tri(hydroxyethyl)ester of glycerol, and turkish red oil may be added.

Furthermore (a) surface-active compound(s) is preferably also added to the finisher. The concentration thereof may vary within broad ranges provided the finisher shows no excessive degree of foaming when plates are finished. Preferred surface-active compound are anionic or non-ionic surface-active compound.

A suitable finisher as disclosed in U.S. Pat. NO. 4,563,410 is a composition comprising a solution of a mercaptotriazole in a solution of polyethylene oxide with a molecular weight of 4,000. Further suitable finishers have been described in i.a. U.S. Pat No. 4,062,682.

At the moment the treatment with the finisher is started the surface carrying the silver pattern may be in dry or wet state. In general, the treatment with the finisher does not take long, usually not longer than about 30 seconds and it may be carried out immediately after the processing and uncovering steps, preferably at a temperature of the finisher in the range from 30° C. to 60° C.

The finisher can be applied in different ways such as by rubbing with a roller, by wiping with an absorbent means e.g. with a plug of cotton or sponge, or by dipping the material to be treated in the finisher. The image-hydrophobizing step of the printing plate may also proceed automatically by conducting the printing plate through a device having a narrow channel filled with the finisher and conveying the printing plate at the end of the channel between two squeezing rollers removing the excess of liquid.

As soon as the hydrophilic surface of a support carrying the silver image has been treated with the finisher, it is ready to be used as a printing plate.

The following examples illustrate the present invention without however, limiting it thereto. All parts, percentages and ratios are by weight unless otherwise indicated.

EXAMPLE 1

A 0.30 mm thick aluminum foil (AA 1050) was degreased by immersing the foil in an aqueous solution containing 5 g/l of sodium hydroxide at 50° C. for 20 s and rinsed with demineralized water. The foil was then electrochemically grained using an alternating current in an aqueous solution containing 4 g/l of hydrochloric acid, 4 g/l of hydroboric acid and 0.5 g/l of aluminum ions at a temperature of 35° C. for 90 s and a current density of 1200 A/m$^2$ to form a surface topography with an average center-line roughness Ra of 0.5 µm. After rinsing with demineralized water the aluminum foil was then etched with an aqueous solution containing 300 g/l of sulfuric acid at 60° C. for 180 seconds and rinsed with demineralized water of 25° C. for 30 s. The foil was subsequently subjected to anodic oxidation in an aqueous solution containing 200 g/l of sulfuric acid at 45° C. for 160 s to form an anodic oxidation film of 2.60 g/m$^2$ of $Al_2O_3.H_2O$, then washed with demineralized water at 25° c for 35 s and finally dried. The thus obtained aluminum foil is called support A.

A support B was prepared similar to the above procedure with the difference that the anodized aluminum foil after rinsing with demineralized water was posttreated with a 2% aqueous solution of sodium bicarbonate and subsequently rinsed with demineralized water of 25° C. for 35 s and finally dried.

A support C was made similar to the procedure disclosed for support A, with the difference that the anodized aluminum foil after rinsing with demineralized water was posttreated with a 0.20% aqueous solution of compound 3 and subsequently rinsed with demineralized water of 25° C. for 35 s and finally dried.

The 3 obtained aluminum supports were each coated with a silver-receptive stratum containing 1.1 mg/m$^2$ PdS as physical development nuclei.

An intermediate layer was then provided on the dry silver-receptive stratum from an aqueous composition in such a way that the resulting dried layer had a weight of 0.5 g of polymethyl methacrylate beads per m$^2$, said composition comprising:

| | |
|---|---|
| a 20% dispersion of polymethyl methacrylate beads in a mixture of equal volumes of water and ethanol having an average diameter of 1.0 µm | 50 ml |
| Helioechtpapierrot BL (trade mark for a dye sold by BAYER AG, D-5090 Leverkusen, West-Germany) | 2.5 g |
| saponine | 2.5 g |
| sodium oleylmethyltauride | 1.25 g |
| demineralized water (pH-value: 5.6) | 300 ml |

Finally a substantially unhardened photosensitive negative-working cadmium-free gelatin silver chlorobromoiodide emulsion layer (97.98 / 2 / 0.02 mol%) containing 1 mmole/mole AgX of 4-hydroxy-6-methyl-1,3,3a,7-tetraazaindene was coated on the intermediate layer, the silver halide being provided in an amount corresponding to 2.40 g of silver nitrate per m$^2$ and the gelatin content of the emulsion layer being 1.58 g/m$^2$, consisting of 0.7 g/m$^2$ of a gelatin with a viscosity of 21 mPa.s and the remainder of a gelatin with a viscosity of 14 mPa.s The 3 obtained unexposed monosheet DTR materials were immersed for 8 s at 25° C. in a freshly made developing solution having the following ingredients:

| | |
|---|---|
| carboxymethylcellulose | 4 g |
| sodium hydroxide | 22.5 g |
| anhydrous sodium sulphite | 120 g |
| hydroquinone | 20 g |
| 1-phenyl-4-methyl-3-pyrazolidinone | 6 g |
| potassium bromide | 0.75 g |
| anhydrous sodium thiosulphate | 8 g |
| ethylene diamine tetraacetic acid tetrasodium salt | 2 g |
| demineralized water to make | 1000 ml |
| pH (24° C.) = 13 | |

The initiated diffusion transfer was allowed to continue for 30 s to form a silver layer on each of the 3 supports.

To remove the developed silver halide emulsion layer and the swollen intermediate layer from the aluminum foils the developed mono-sheet DTR materials were rinsed for 30 s with a water jet at 30° C.

The amount of silver deposited (silver yield) in the image receiving layer was then measured using an analytical X-ray Fluorescence Spectrophotometer PHILIPS 1400 (commercially available from Philips). The results obtained for each of the 3 DTR materials are given in table 1.

TABLE 1

| Support | Silver yield[a] | Silver yield[b] | Δ Silver yield |
| --- | --- | --- | --- |
| A | 1.49 g/m$^2$ | 1.33 g/m$^2$ | 0.16 g/m$^2$ |
| B | 1.54 g/m$^2$ | 1.44 g/m$^2$ | 0.10 g/m$^2$ |
| C | 1.61 g/m$^2$ | 1.53 g/m$^2$ | 0.08 g/m$^2$ |

Remarks:
[a] Silver yield in the image receiving layer after treatment with the finisher.
[b] Silver yield in the image receiving layer after rubbing the finished plate with a plug of cotton made wet with water.
[c] Δ Silver yield is the loss in silver yield caused by rubbing the finished plate with a plug of cotton made wet with water and is a measure for the adhesion of the silver (a lower amount indicates a better adhesion resistance).

From the above it can be seen that when the grained and anodized aluminum foil was posttreated with a 0.2% aqueous solution of compound 3 (support C according to the invention), the silver yield and the wear resistance is clearly improved in comparison with the case where the aluminum foil is not posttreated (support A: comparison) or is posttreated with a 2% sodium bicarbonate solution (support B comparison).

EXAMPLE 2

A support D, E or F was made similar to the procedure disclosed for support C in example 1, with the difference that the anodized aluminum foil after rinsing with demineralized water was posttreated with a 0.05%, a 0.1% or a 0.4% aqueous solution of compound 3. These three supports and support B were coated and the obtained mono-sheet DTR materials processed as described in example 1. The results obtained for each of the 4 DTR materials are given in table 2.

TABLE 2

| Support | Silver yield[a] | Silver yield[b] | Δ Silver yield |
| --- | --- | --- | --- |
| B | 1.43 g/m$^2$ | 1.34 g/m$^2$ | 0.09 g/m$^2$ |
| D | 1.50 g/m$^2$ | 1.44 g/m$^2$ | 0.06 g/m$^2$ |
| E | 1.51 g/m$^2$ | 1.48 g/m$^2$ | 0.03 g/m$^2$ |
| F | 1.52 g/m$^2$ | 1.48 g/m$^2$ | 0.04 g/m$^2$ |

Remarks:
[a], [b], [c] see table 1.

From the above it can be seen that when the grained and anodized aluminum foil was posttreated with a 0.05%, a 0.1% or a 0.4% aqueous solution of compound 3 (supports D, E and F according to the invention), the silver yield and the wear resistance is clearly improved in comparison with the case where the aluminum foil is posttreated with a 2% sodium bicarbonate solution (support B comparison). So the organic compounds having at least one cationic group for use in accordance with the present invention may be used in a wide concentration range in order to obtain the desired results.

EXAMPLE 3

A support G, respectively H was made similar to the procedure disclosed for support C in example 1, with the difference that the anodized aluminum foil after rinsing with demineralized water was posttreated with a 0.05% or a 0.4% aqueous solution of compound 4.

The aluminum supports A, B, G and H were each coated with a silver-receptive stratum containing 25 mg/m$^2$Ag (Carey Lea sol) as physical development nuclei.

These 4 intermediate materials were then each coated with an intermediate layer and a substantially unhardened photosensitive negative-working cadmium-free gelatin silver chlorobromoiodide emulsion layer and processed as described in example 1. The results obtained for each of the 4 DTR materials are given in table 3.

TABLE 3

| Support | Silver yield[a] | Silver yield[b] | Δ Silver yield |
| --- | --- | --- | --- |
| A | 0.91 g/m$^2$ | 0.86 g/m$^2$ | 0.05 g/m$^2$ |
| B | 1.00 g/m$^2$ | 0.94 g/m$^2$ | 0.06 g/m$^2$ |
| G | 1.10 g/m$^2$ | 1.05 g/m$^2$ | 0.05 g/m$^2$ |
| H | 1.10 g/m$^2$ | 1.04 g/m$^2$ | 0.06 g/m$^2$ |

Remarks:
[a], [b], [c] see table 1.

From the above it can be seen that when the grained and anodized aluminum foil was posttreated with an 0.05% or a 0.4% aqueous solution of compound 4 (supports G and H according to the invention), the silver yield is clearly improved in comparison with the case where the aluminum foil is not posttreated (support A: comparison) or is posttreated with a 2% sodium bicarbonate solution (support B comparison), irrespective of the nature of the physical development nuclei, it being palladium sulfide as in example 1 and 2 or colloidal silver as in the present example.

We claim:

1. A method for preparing an image receiving element comprising an aluminum foil as support comprising the steps of roughening and anodizing said aluminum foil and applying an image receiving layer containing physical development nuclei on said aluminum foil characterized in that said roughened and anodized aluminum foil is posttreated with an aqueous solution containing one or more organic compounds having at least one cationic group before the image receiving layer comprising physical development nuclei is applied to said roughened and anodized aluminum foil.

2. A method according to claim 1 wherein the total amount of said organic compounds in said aqueous solution ranges from 0.005 to 4 % by weight.

3. A method according to claim 1 wherein at least one of said one or more organic compounds is a quaternary phosphonium salt.

4. A method according to claim 1 wherein at least one of said one or more organic compounds is a polymer.

5. A method according to claim 1 wherein at least one of said one or more organic compounds is a compound comprising randomly distributed recurring units corresponding to the general formula (I)

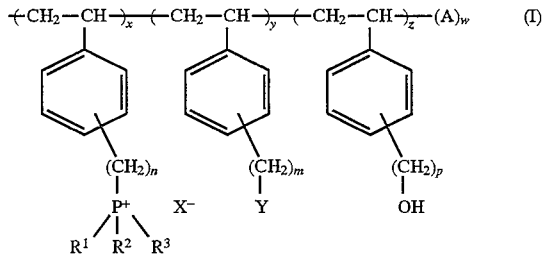

wherein:

A represents a unit that is derived from a copolymerizable monomer having a hydrophobic character;

n, m and p each independently represents an integer ranging from 1 to 12;

$R^1$, $R^2$ and $R^3$ each independently represents a $C_1$–$C_8$ alkyl group, a substituted $C_1$–$C_8$ alkyl group, a cycloalkyl group, an aryl group or a substituted aryl group;

X⁻ represents an acid anion;

Y represents a nucleophilic group;

x+y+z represents from 2 mole % to 70 mole % with y+z maximum 15 mole % and x at least 1 mole % and w represents from 30 mole % to 98 mole %.

6. A method according to claim 1 wherein at least one of said one or more organic compounds is a compound comprising randomly distributed recurring units corresponding to the general formula (II)

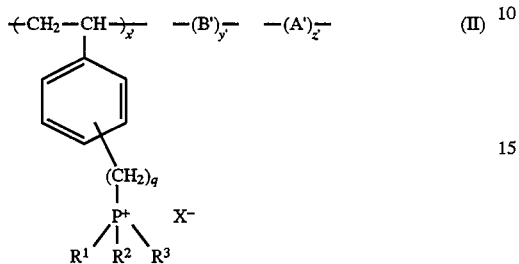

wherein:

B' represents a unit that is derived from a copolymerizable monomer comprising a nitrogen atom linked to at least one vinyl group or at least one alkyl group;

A' represents a unit that is derived from a copolymerizable monomer having a hydrophobic character;

q represents an integer ranging from 1 to 12;

$R^1$, $R^2$ and $R^3$ each independently represents a $C_1$–$C_8$ alkyl group, a substituted $C_1$–$C_8$ alkyl group, a cycloalkyl group, an aryl group or a substituted aryl group;

X⁻ represents an acid anion;

x' represents from 5 mole % to 80 mole %;

y' represents from 20 mole % to 95 mole % and z' represents from 0 mole % to 65 mole %.

7. A method according to claim 1 wherein after said roughening and before said anodization a chemical etching step is carried out using an aqueous solution containing an acid or using in the order given an alkaline solution, an optional rinsing solution and an acid solution.

8. A method according to claim 1 wherein there is further applied a silver halide emulsion layer to said image receiving layer.

9. A mono-sheet DTR material obtainable by the method defined in claim 8.

* * * * *